(12) United States Patent
Clarke

(10) Patent No.: US 8,663,389 B2
(45) Date of Patent: Mar. 4, 2014

(54) METHOD AND APPARATUS FOR CRYSTAL GROWTH USING A MEMBRANE-ASSISTED SEMI-CLOSED REACTOR

(76) Inventor: Andrew Peter Clarke, Santa Barbara, CA (US)

( * ) Notice: Subject to any disclaimer, the term of this patent is extended or adjusted under 35 U.S.C. 154(b) by 253 days.

(21) Appl. No.: 13/113,032

(22) Filed: May 21, 2011

(65) Prior Publication Data

US 2012/0291696 A1   Nov. 22, 2012

(51) Int. Cl.
   *C30B 25/14*   (2006.01)

(52) U.S. Cl.
   USPC .......... 117/102; 117/84; 117/85; 117/86; 117/88; 117/89; 117/91; 117/93; 117/99; 117/105; 117/200; 117/201; 117/202; 118/715; 118/720; 118/722; 118/733; 252/518.1; 252/521.6; 252/584; 257/615; 257/E33.025; 257/E33.028; 257/E33.03; 257/E33.033

(58) Field of Classification Search
   USPC .............. 117/84–86, 88–89, 91, 93, 99, 102, 117/105, 200–202, 906, 952; 118/715, 720; 118/722, 733; 252/518.1, 521.6, 584; 257/615, E33.025, E33.028, E33.03, 257/E33.033

See application file for complete search history.

(56) References Cited

U.S. PATENT DOCUMENTS

| | | | |
|---|---|---|---|
| 4,147,571 A * | 4/1979 | Stringfellow et al. | 117/104 |
| 7,314,515 B2 * | 1/2008 | Han | 117/2 |

* cited by examiner

*Primary Examiner* — Michael Kornakov
*Assistant Examiner* — Kenneth A Bratland, Jr.

(57) ABSTRACT

A method and apparatus for depositing III-V material is provided. The apparatus includes a reactor partially enclosed by a selectively permeable membrane 12. A means is provided for generating source vapors, such as a vapor-phase halide of a group III element (IUPAC group 13) within the reactor volume 10, and an additional means is also provided for introducing a vapor-phase hydride of a group V element (IUPAC group 15) into the volume 10. The reaction of the group III halide and the group V hydride on a temperature-controlled substrate 18 within the reactor volume 10 produces crystalline III-V material and hydrogen gas. The hydrogen is preferentially removed from the reactor through the selectively permeable membrane 12, thus avoiding pressure buildup and reaction imbalance. Other gases within the reactor are unable to pass through the selectively permeable membrane.

11 Claims, 2 Drawing Sheets

--Prior Art--

METHOD AND APPARATUS FOR CRYSTAL GROWTH USING A MEMBRANE-ASSISTED SEMI-CLOSED REACTOR

BACKGROUND OF THE INVENTION

1. Field of Invention

This invention relates to the use of vapor phase epitaxy to grow a crystal layer on a surface, specifically to the growth of a nitride semiconductor crystal ingot in a hydride vapor phase epitaxy reactor.

2. Discussion of Prior Art

Epitaxy is the growth of a mono-crystalline layer on a mono-crystalline substrate. Vapor phase epitaxy (VPE) achieves this by reacting one or more source gases, or "precursors" on the substrate.

Hydride vapor phase epitaxy (HVPE) is a form of VPE in which the vapor-phase precursors typically comprise a halide of a group III metal (IUPAC group 13), and a hydride of a group V element (IUPAC group 15) resulting in a "III-V" material. HVPE has been widely used in fabricating an important subgroup of the materials called the "III-nitrides." The III-nitride materials include gallium nitride (GaN), aluminum nitride (AlN), indium nitride (InN) and combinations formed from these three that may be doped with additional elements to customize their band-gap or lattice parameters. III-nitride semiconductors are used as substrates and as component layers in high-brightness light emitting diodes (HB-LEDs) and blue laser diodes (LDs). HB-LEDs are expected to replace compact fluorescent lights and traditional incandescent lighting over the next few years. The III-nitride substrate also has great advantages for a variety of high-power, high-frequency, and high-temperature integrated circuit applications. The ongoing problem is that the III-nitride substrates are very expensive and difficult to produce.

In epitaxy, the growing crystal layer indexes its structure to the crystal structure of the substrate. If the unit cells of the growing crystal layer have length or width dimension that differ from those of the substrate crystal, they may deform in those dimensions to force a match between crystal lattices at the layer-substrate interface. The resulting deformation accumulates in the plane of the interface until a crystal growth dislocation, or "defect," is generated to relieve some of the strain in the layer. Such defects are replicated in subsequent layers, propagating from the substrate interface upward through the many layers of the grown, crystal, until the crystal accumulates enough volume to absorb the strain, at which point the defect is sometimes absorbed or grown over. Similar defects may also form as a result of, variations in the growth conditions across the substrate, in which case they are continually generated during growth.

A III-nitride substrate is cut from a thick single-crystal ingot. Ideally, it is cut from an area where there are fewer defects, far enough from the substrate interface so that the defects from lattice mismatch are at a minimum. Unfortunately, thick III-nitride ingots have proven to be very difficult to grow. The internal stress and defects, induced during initial ingot growth on lattice-mismatched substrates and further generated by non-uniform reactor growth conditions, have limited practical ingot width to about 50 mm (2"). Furthermore, the low material efficiency inherent to the prior art HVPE technology has added to their high cost.

In conventional HVPE, flowing halide and hydride source vapors, or "precursors," are heated and mixed upstream from a substrate, then flowed downstream to cross the substrate and finally exit through an exhaust port. As the precursor mixture flows across the substrate, the precursors react on the surface to form the III-nitride crystal layer. At the same time, this reaction releases hydrogen ($H_2$) and hydrogen chloride (HCl). In the case of GaN HVPE, used here as illustrative example, the surface reaction is described by the following relation:

$$NH_3^{(gas)} + GaCl^{(gas)} \rightarrow GaN^{(solid)} + HCl^{(gas)} + H_2^{(gas)} \qquad \text{Eq. 1}$$

Hydrogen chloride and $H_2$ gas evolved in the reaction are entrained in the gas stream as it crosses the surface. Within the flow-induced boundary layer, which forms between the growth surface and the main gas stream, the gas composition is continuously depleted of $NH_3$ and GaCl, and enriched with the reaction byproduct gases, HCl and $H_2$. Additionally, this boundary layer goes through a transition from laminar to turbulent flow and gets thicker with distance. The changing structure and composition of the flowing boundary layer generates a non-uniformity of growth conditions across the surface. This non-uniformity of growth conditions leads to a non-uniformity of growth kinetics and the accumulation of internal strain, which contributes to defect generation and reduced crystal stability.

In FIG. 1A, the effects described above are illustrated. A gas stream flowing from the left to the right across a surface at first exhibits laminar flow, but when the boundary layer reaches a critical thickness, drag begins to force the gas stream to rotate near the substrate, and flow becomes turbulent. The overall flow continues rightward, while the boundary layer gets thicker and accumulates more HCl and $H_2$.

In FIG. 1B, the effect of no lateral gas flow is illustrated. As the surface reaction of Eq. 1 proceeds, the thin layer of gas mixture near the growth surface become depleted of $NH_3$ and GaCl, and enriched with the reaction byproduct gases, HCl and $H_2$. This causes the layer to become buoyant, and it breaks up into small volumes of gases that move upward. These rising "micro-plumes" are replaced by downward falling plugs of heavier gas that is still rich with $NH_3$ and GaCl. The resulting turbulence averages out within a short lateral distance, and results in highly uniform average conditions across the substrate.

Current HVPE reactor technology is classified according to the way precursors are flowed in relation to the substrate. Horizontal flow reactors flow the gas mixture parallel to and across the substrate surface, while vertical reactors flow the gas mixture at 90 degrees to the substrate surface, forcing flow to be diverted across and around the substrate.

Examples of horizontal flow reactors are described by G. M. Jacob and J. P. Hallais, and by T. Shibata et al. In horizontal flow HVPE reactors, the substrate is oriented approximately parallel to the gas stream, and may be rotated to help even out the effect of gas stream composition, changes. Nonetheless, surface elements at the center of the substrate do not experience the same process environment as surface elements radially displaced toward the edge, the $H_2$ and HCl content increases toward the center, and this effect gets more pronounced as the diameter of the substrate is increased. This issue grows as substrate size increases, since the boundary layer grows thicker as it flows further across a substrate. The changing concentration of HCl and $H_2$ in the flow-induced boundary layer causes a variation in growth conditions across the substrate, and results in lateral internal strain within the growing layer. Increasing substrate size increases the distance over which these effects accumulate, and conventional HVPE has therefore been unsuccessful in scaling GaN growth process wider than about 50 or 60 mm (2-2.5").

In the continuous flow of precursor gas past a substrate, only a small portion is reacted at the surface, while the rest is swept downstream unused. In the case of horizontal flow GaN HVPE, about 95% of the GaCl passes through the reactor without contributing to crystal growth at the substrate. Some of the unused precursor gas mixture forms "parasitic deposits" of polycrystalline GaN on the reactor walls, the rest exits through an exhaust duct and must be treated and have its gallium reclaimed. This inefficiency is expensive, and contributes to the high cost of even small GaN substrates.

An example of a vertical flow HVPE reactor is described by G. B. Stringfellow and H. T. Hall. Vertical flow HVPE reactors position the substrate facing the gas flow, causing variations in pressure and velocity as the gas mixture is redirected around the substrate. In vertical flow, the boundary layer is compressed and the $H_2$ and HCl content increases toward the periphery. A compressed boundary layer is a lower barrier to diffusion mass transport, and the vertical flow orientation intersects more of the gas stream. These two factors help vertical flow HVPE reactors to operate at better efficiency than horizontal flow versions, getting 5-12% gallium utilization, compared to 2-7% in horizontal flow designs. As with the horizontal flow, however, radial difference in growth conditions lead to ingots with high internal strain and defects, limiting the size and quality of crystals that can be grown to about 50 mm (2").

Both horizontal and vertical HVPE reactors are considered "open" designs; gases flow in at one end and out at the other. A "closed" reactor re-circulates reactants within a closed container, and so has the potential to be extremely efficient. In the case of GaN growth, closed reactor designs are typically not vapor-phase reactors, but liquid-phase ammonothermal designs. In ammonothermal growth, an autoclave is used to contain the high pressure and temperature needed for liquid-phase GaN growth, and crystals grown this way are reported to have very low defect densities. The growth rate is slow, however, and the crystals are small, irregularly shaped, and often contain high levels of unintended dopants. An, example of ammonothermal GaN growth is taught by M. P. D'evelyn et al.

A closed HVPE reactor design is disclosed by Jai-yong Han. Han claims that gas flow to the substrate is driven by thermal convection, since he maintains the lower portion of his reactor at a higher temperature than the upper portion: hot gases rise up the walls, cool and become denser in the upper portion, and descend down the central axis past a downward-facing substrate. Han reports growth rates roughly half of conventional. HVPE, but claims the efficiency of his reactor is about 20-25%, with 75-80% of the gallium being consumed in parasitic depositions. Still, this is twice the efficiency of even the most efficient vertical open flow reactor designs.

Like most conventional HVPE reactors, Han's contains a receptacle for holding liquid gallium (Ga) metal. HCl gas reacts with the Ga surface and creates the GaCl precursor according to the following equation:

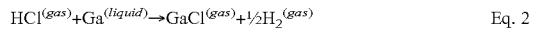

$$HCl^{(gas)} + Ga^{(liquid)} \rightarrow GaCl^{(gas)} + \tfrac{1}{2}H_2^{(gas)} \qquad \text{Eq. 2}$$

This is the source of GaCl needed for the growth reaction described by Eq. 1. The initial production of GaCl within a closed HVPE reactor is "primed" by the injection of HCl, and then sustained by the HCl released and recycled during GaN growth. Recycling HCl in this application involves the consumption of $NH_3$, per Eq. 1, and Eq. 2 indicates that an overpressure of $H_2$ is continuously created by the HCl cycle. The increasing $H_2$ content within Han's closed reactor changes the balance of Eq.s 1 and 2 and also leads to continuously increasing gas pressure.

In a closed HVPE reactor where no material is added or released, all reactions stop when either the hydride (i.e., $NH_3$) or the metal (i.e., Ga) are used up. During this time, the reactor's internal pressure will have increased 25% due to the evolution of $H_2$ gas. Further input of $NH_3$ will restart the growth reactions, but the addition of one unit of $NH_3$ will result in a pressure increase proportional not only to the one unit, but to another half unit from $H_2$ production.

If Han's closed reactor is operated at 10 atmospheres of pressure, the upper limit cited by Han, then the enclosed gas volume at 800° C. must be 6100 times the finished ingot volume (at 25% efficiency, as defined by Han). For example, to grow an ingot 50 mm (2") in diameter and 10 min (⅜") thick, the reactor must be roughly 60 cm (24") in diameter and 60 cm (24") tall. To grow an ingot that would yield about 40 wafer substrates 100 mm (4") in diameter would require a reactor 1.2 meters (4') tall and 1.2 meters (4') wide. Considering the temperature and pressure requirements, this would be a very expensive and potentially dangerous quartz vessel. Scaling it to grow ingots for state-of-the-art production (for example, 80 wafers at 200 mm diameter) would require a chamber over 4 meters (12') tall and 2.2 meters (7') in diameter, heated to 800° C. and containing 10 atmospheres (140 p.s.i.) of pressure. Unless large and inexpensive hyperbaric reactor vessels become available, closed reactor HVPE is not going to be an economically practical solution.

It has been assumed that nitrogen gas ($N_2$) is generated within a closed or open GaN HVPE reactor, though in smaller volumes than $H_2$—Several potential $NH_3$ and $N_2$-producing reactions have been proposed in the literature, including the following:

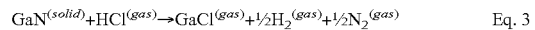

$$GaN^{(solid)} + HCl^{(gas)} \rightarrow GaCl^{(gas)} + \tfrac{1}{2}H_2^{(gas)} + \tfrac{1}{2}N_2^{(gas)} \qquad \text{Eq. 3}$$

$$2NH_3^{(gas)} \rightarrow N_2^{(gas)} + 3H_2^{(gas)} \qquad \text{Eq. 4}$$

$$2GaN^{(solid)} + 3H_2^{(gas)} \rightarrow Ga^{(liquid)} + 2NH_3^{(gas)} \qquad \text{Eq. 5}$$

$$GaN^{(solid)} + HCl^{(gas)} + H_2^{(gas)} \rightarrow GaCl^{(gas)} + NH_3^{(gas)} \qquad \text{Eq. 6}$$

Han sees no parasitic GaN growth in the hotter (lower) part of his reactor, asserting that the reaction described in Eq. 3, above, dominates at higher temperatures, and prevents it.

Han's assertion is not well-supported by the reports of others, however, and he does not report measuring any $N_2$ in his reactor. In fact, no reports of $N_2$ generation in actual GaN HVPE environments have been found. This inconsistency may lie in the assumption that reactions such as those described in Eq. 3, 4, and 5, though valid as stand-alone reactions, are unaffected by the presence of other HVPE gases. For instance, M. A. Mastro et al. confirmed that HCl alone (Eq. 3) would etch a GaN sample, and M. Furtado and G. Jacob showed that a mixture of HCl+$H_2$ (Eq. 6) will even more aggressively etch a GaN sample, but A. Trassoudaine et al. showed that the etching of GaN by HCl alone (Eq. 3) did not occur in an HVPE environment where $NH_3$ was present.

On the contrary, Trassoudaine teaches that additional HCl could enhance epitaxial GaN growth rates on the (001) plane while reducing parasitic GaN growth on reactor walls in. The enhanced (001) growth was attributed by Trassoudaine to a de-chlorination mechanism, while the reduction in parasitic GaN growth with excess HCl may have more to do with the exposure of highly reactive non-(001) GaN crystal planes exposed in polycrystalline GaN (i.e., parasitic deposits) vowing on non-epitaxial reactor walls. This theory is supported by Mastro, who reports variations in GaN crystal plane reactivity, especially in the presence of HCl. Furthermore, Furtado's work indicates that the reduction of parasitic GaN growth is most correctly explained by HCl+$H_2$, not HCl alone, and results in the production of GaCl+$NH_3$, as in Eq. 6, which is just the reverse of Eq. 1. Thus, the production of $N_2$ in a GaN HVPE environment is undetected and unlikely, and the only significant non-recyclable gas byproduct of GaN HVPE is H$_2$.

Han's closed reactor reportedly grows a very high quality, low defect GaN ingot without flowing precursors, and infers that this is due to the use of GaN substrates. Han claims a convection flow driven by the temperature difference between the lower and upper portions of his reactor, the lower portion being hot enough to suppress parasitic nucleation and the upper portion maintained 100° C. to 200° C. cooler. This infers that GaN growth will occur at the substrate and on all surfaces within the upper, cooler portion.

What is needed is 1) an HVPE reactor that can eliminate the non-uniform effect of a flow-induced boundary layer so that large III-V crystals can be grown, and 2) a way to conserve and recycle precursor gases within the HVPE reactor and grow large ingots without requiring large, expensive reactors.

OBJECTS AND ADVANTAGES

Accordingly, several objects and advantages of the present invention are:
(a) to provide a mechanism for the selective removal of H$_2$ from the HVPE growth reactor without the removal of metal-containing precursor gases or interruption of the growth process;
(b) to provide a III-nitride HVPE reactor and method capable of growing large low stress ingots from, which large wafer substrates with, low defects and internal strain can be fabricated;
(c) to provide a III-nitride HVPE crystal growth reactor and method that advantageously uses less energy to operate than the prior art by flowing less heated gas out of the reactor,
(d) to provide a III-nitride HVPE crystal growth reactor with little or no dangerous ammonia or chloride exhaust emissions, so that it requires little or no special waste disposal effort and may be more easily permitted for use;

A further, object is to provide large high-quality GaN wafer substrates to the makers of HB-LEDs so that the performance of these important light sources may be greatly improved, their cost greatly reduced, and their advantageous adoption for general illumination enabled. Still further objects and advantages will become apparent from the consideration of the ensuing description and drawings.

SUMMARY

The present disclosure describes a membrane-assisted semi-closed HVPE reactor and method of use that provides sustained and efficient steady-state crystal growth. A selectively permeable membrane provides part of the reactor enclosure, and the internal pressure, temperature, and gas composition may be maintained at steady average values throughout extended periods of crystal growth because of the selective removal of hydrogen gas through the permeable membrane.

DRAWINGS

Figures

Figure 1:
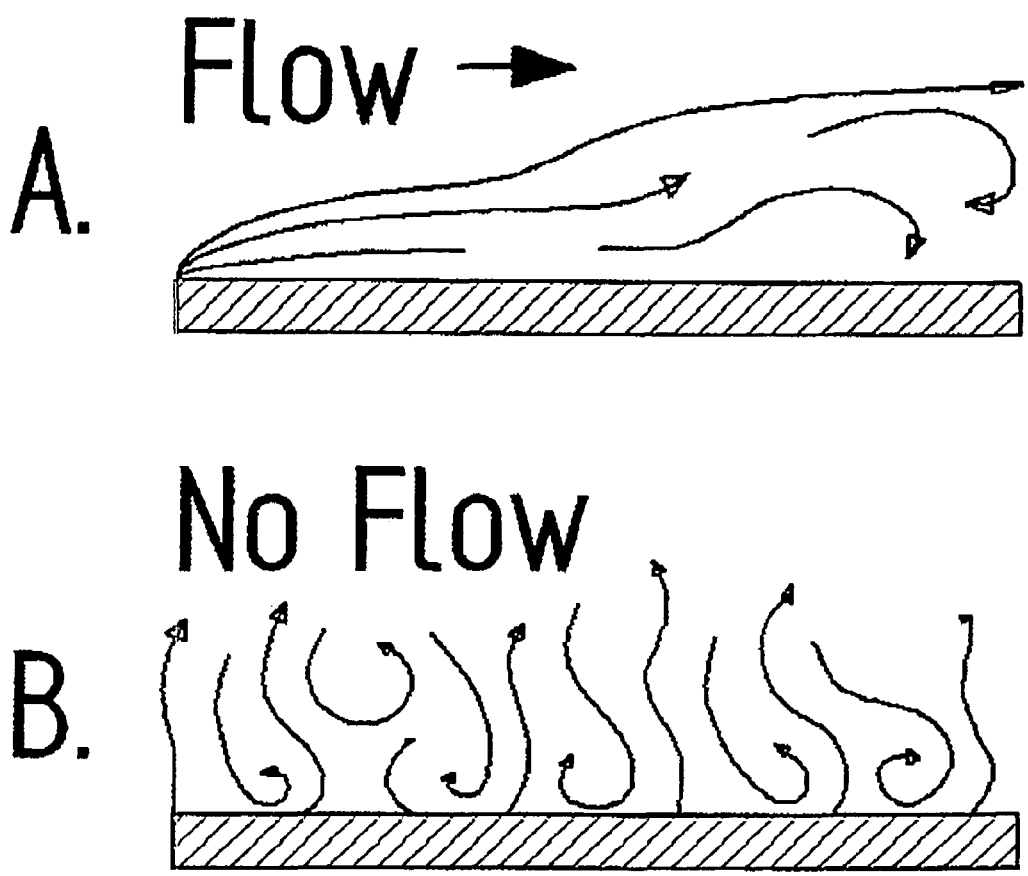
FIG. 1A (Prior Art) is a representation of the gas stream profile of horizontal gas flow across a substrate.
FIG. 1B (Prior Art) depicts the turbulent micro-plume gas updrafts and downdrafts generated by changes in gas buoyancy at the growth surface in a flow-free environment.
Figure 2:
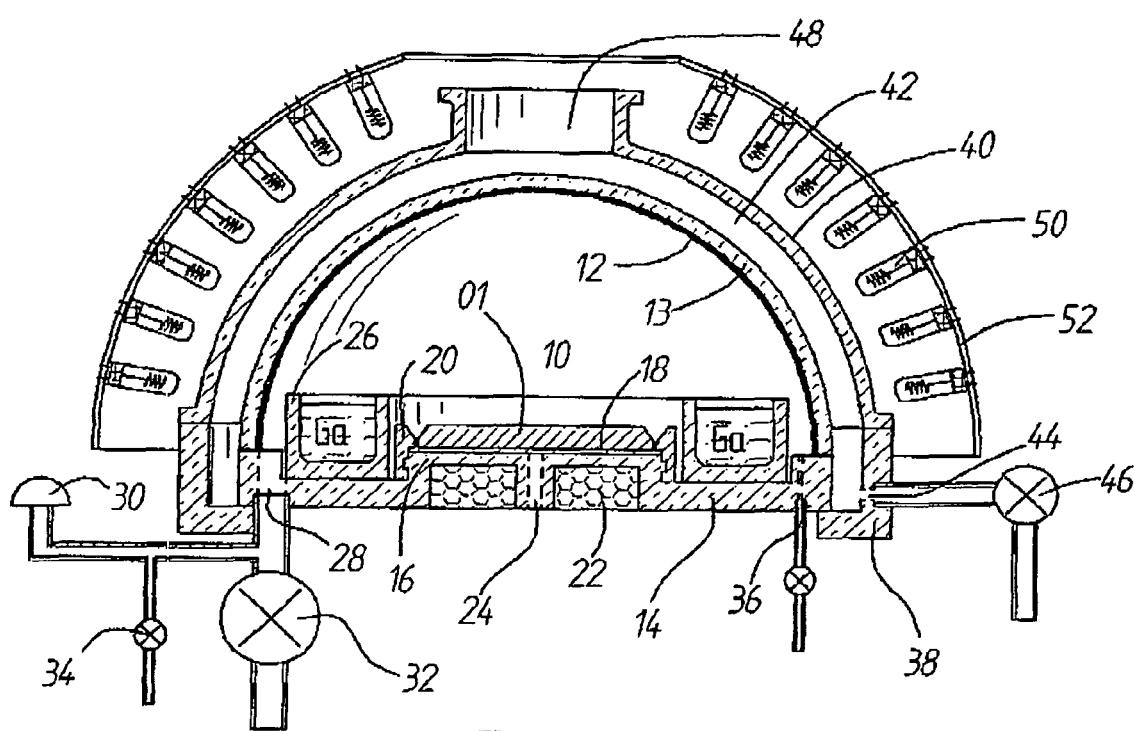

FIG. 2 schematically represents a cross-section of a preferred embodiment of the present invention.

| DRAWINGS - REFERENCE NUMERALS | |
|---|---|
| 01 | GaN Crystal Ingot |
| 10 | Reactor Volume |
| 12 | Membrane |
| 13 | Membrane Support |
| 14 | Base |
| 16 | Pedestal |
| 18 | Substrate |
| 20 | Edge Clamp |
| 22 | Heater |
| 24 | Hole |
| 26 | Crucible |
| 28 | Port |
| 30 | Exhaust Valve |
| 32 | Foreline Valve |
| 34 | Gas Entry Port |
| 36 | Gas Entry Port |
| 38 | Collar |
| 40 | Quartz Bell Jar |
| 42 | Gap |
| 44 | Sweep Gas Port |
| 46 | Valve |
| 48 | Exit Pathway |
| 50 | Heat Lamp |
| 52 | Lamp Support |

DETAILED DESCRIPTION

Preferred Embodiment—FIG. 2

A preferred embodiment of the membrane-assisted semi-closed (MASC) reactor of the present invention is schematically illustrated in the cross-sectional side view of FIG. 2. The reactor volume 10 is enclosed by a hydrogen-permeable membrane 12 and a base 14. The membrane 12 is selectively permeable to hydrogen gas and forms the walls and ceiling of the volume 10, while the base 14 forms the floor. The base 14 may be made of quartz, aluminum oxide, aluminum nitride, or other suitable ceramic. The membrane is attached to or formed or deposited onto a porous membrane support 13 that is permeable to all gases, not prone to react with the membrane 12 under normal operating conditions, and thick enough to structurally support the membrane 12.

The membrane support 13 may be made of a porous ceramic from the group that includes aluminum oxide, zirconium oxide, and any other suitable ceramics that can be formed as porous structural shapes. The membrane support 13 may also be made of a porous metal suitable for high temperature use from the group that includes porous stainless steel, porous titanium, porous palladium, or an alloy. A suitable barrier film may be applied to the support and the walls of its pores and channels to separate the support 13 from the membrane 12. Suitable barrier films may be applied to the support 13 by atomic layer deposition (ALD) using precursors and techniques familiar to those practiced in the art. Barrier films include coatings from the group that includes titanium nitride and tungsten nitride, or a cermet coating from the group that includes palladium aluminum oxide and palladium zirconium oxide, or a proton conductive ceramic from the group that includes barium titanium oxide, strontium cerium oxide, barium zirconium oxide, and their yttrium-doped variations.

At this time, I prefer a high-fired aluminum oxide porous ceramic material available from Soilmoisture Equipment Corporation, of Goleta Calif. for use as a membrane support 13. The ceramic variety that T presently prefer, called "BO1M3" has porosity of about 45% by volume, with an average pore size of 2.5 microns, and is available in standard shapes. Although FIG. 2 shows a preferred domed membrane support 13, the reactor volume 10 may instead have separate walls and a ceiling, either of which or both may serve as the membrane support component. The membrane support may also be a tubular appendage to the reactor. In the range of conceivable reactor geometries, there is little limitation on the location or shape of the membrane support, as long as function is preserved. The preferred method for sealing the joint between the membrane support 13 and the base 14 in the preferred embodiment (FIG. 2) is by palladium metal gasket. Other better gasket materials may become available and more easily used, such as palladium-gallium alloys.

The hydrogen-permeable membrane 12 may be constructed in a number of ways. At this time, I most prefer that it is made from a high-temperature proton conducting (HTPC) ceramic. The preferred HTPC material can be deposited as a continuous film onto the membrane support 13 using a sol-gel synthesis technique, which, will be described.

Although there are several candidate HTPC materials that may be formed into membranes by the sol-gel technique, at this time 1 most prefer yttrium-doped barium zirconium-oxide. This HTPC material has the chemical formulation $BaZr_{0.8}Y_{0.2}O_{3-\delta}$, and is referred to as "BZY."

The BZY coating solution is made by mixing the correct proportions of barium, zirconium, and yttrium (i.e., Ba:Zr:Y in the ratio 5:4:1), using their, commercially-available metal, nitrates. These can be purchased from Alfa Aesar, a Johnson Matthey company. Citric acid is used as a chelating agent, and added to the metal nitrate mixture to achieve a molar ratio of 2:1 between citric acid and the total number of metal atoms (Ba+Zr+Y). This mixture is dissolved in slightly more than enough ethylene glycol to produce a transparent solution. The solution is heated to 150° C. and stirred until it becomes slightly viscous. This "sol-gel" solution is applied to one side of the membrane support 13 and allowed to air dry for 24 hours.

Application of the sol-gel to the membrane support 13 is effectively accomplished by mounting the support 13 so that it forms one wall of a vacuum chamber, with the side to be coated facing away from the vacuum. This allows a pressure difference to pull the sol-gel partly into the porous membrane support 13. The dry coating and support 13 are then heated slowly to between 1200° C. and 1400° C. in an atmosphere of air or nitrogen with 10% oxygen, and held at temperature for more than 5 hours to form a single-phase BZY coating. This process may be repeated until a continuous BZY film, with no pin holes, is formed on the support 13.

This technique of sol-gel synthesis can be used with virtually any of the HTPC materials now known, with only small variations to the process. It can also be used to deposit cermets, such as palladium-alumina and palladium-zirconia which have shown great promise as selective hydrogen-permeable materials.

Many varieties of HTPC membrane 12 material may be made more robust, though less permeable to $H_2$, by the application of a thin, but continuous, silicon dioxide "cap" layer, This cap layer may be only a few tens of angstroms thick, and is most easily applied using conventional chemical vapor deposition (CVD) techniques and the decomposition of a single precursor gas, tetraethyl orthosilicate, or "TEOS." This process is familiar to anyone practiced in the art.

The hydrogen-permeable membrane 12 may also be formed from palladium (Pd) or a Pd alloy. Because of its delicacy and expense, the Pd membrane is not preferred over the dense HTPC ceramic. It requires very careful programming of the initiation sequence to prevent poisoning or embrittlement of the Pd, but if done carefully, provides an excellent and highly permeable hydrogen-specific membrane. In the case of the foil or film of the hydrogen-permeable metal Pd, an alloy of Pd involving silver (Ag) or other metal may work as well or better. A Pd membrane 12 may be applied to the porous membrane support 13 by CVD, electroless plating, evaporation, sputtering, or combinations of these techniques, which are well-known and familiar to those practiced in the art.

The base 14 has formed into it a central pedestal 16 onto which a substrate 18 is held by edge clamps 20. Thermal contact between the substrate 18 and the pedestal 16 may be enhanced by machining the pedestal surface to be slightly convex, thus forcing the substrate to make firm contact over the entire contact area when the substrate edges are forced down by the edge clamp 20. The substrate 18 may be most preferably a single-crystal GaN wafer, but may also be a silicon-carbide (SiC) or sapphire wafer. A SiC or sapphire substrate 18 may preferably be improved by applying a sputtered aluminum nitride (MN) film onto it prior to use.

A GaN crystal ingot 01 grows on the substrate 18. A heater 22 delivers heat to the base 14, pedestal 16, the substrate 18, and the ingot 01. A central hole 24 in the base 14, behind the substrate 18 provides optical and physical access to the back of the substrate 18. This allows the substrate's temperature to be directly measured by optical pyrometry or a thermocouple, for instance.

A, crucible 26 for holding a Group III metal is proximal to the pedestal 16, in the exemplary embodiment holding liquid gallium metal. The crucible 26 is preferably made from quartz and forms an annular trough surrounding the pedestal 16 and substrate 18.

A pressure control port 28 provides a gas conducting pathway to an exhaust valve 30, which may be in the form of an automatic pressure-relief valve that preferably allows gas to escape from the reactor volume 10 if the internal pressure exceeds a chosen value between 1 and 10 atm, more preferably between 1 and 5 atm, but most preferably between 1 and 2 atm. The pressure control port 28 is in fluid communication with a vacuum pump (not shown) through foreline valve 32, so that the reactor volume 10 may be evacuated and "degassed" prior to operation.

A valved gas entry port 34 for regulated flow of halides, hydrogen, and inert gases is in fluid communication with the reactor volume 10 through the pressure control port 28. A hydride gas entry port 36 is provided in the base 14 for regulated flow of a hydride gas, such as $NH_3$, into the reactor volume 10. Hydride, halide and inert gas flow may be regulated by mass flow controllers.

The base 14 is supported and surrounded around its periphery by a collar 38 that also supports a clear quartz bell jar 40 that generally surrounds the membrane 12. A gap 42 separates the membrane 12 and the quartz bell jar 40. A sweep gas port 44 is provided in the collar 38, through which a regulated flow of sweep gas may enter the gap 42 and bathe the permeate side of the membrane 12. Sweep gas may be clean dry air, but is preferably an inert gas such as $N_2$, mixed with some $O_2$. The $O_2$ in the sweep gas permeates the membrane support and reacts with the $H_2$ emerging from the permeate side of the membrane 12. This reaction forms $H_2O$. In addition, the $O_2$ reacts with any free metal (i.e., aluminum) at the interface between the membrane 12 and the membrane support 13 to reform a metal oxide. The $O_2$ content in the sweep gas may preferably be less than 5% or greater than 20%, but more preferably the $O_2$ content in the sweep gas is between 5% and 20%. A sweep gas shutoff valve 46 is provided to shut the flow of sweep gas into the gap 42, as needed.

An opening 48 at the top of the clear quartz bell jar provides an exit pathway for sweep gas, gases that permeate the membrane 12, and any gases produced by reactions between these. The exit pathway 48 may be contiguously enclosed by a pathway that leads to an external exhaust, vacuum pump, and/or means for gas processing (not shown). The exit pathway 48 also provides optical and physical access to the membrane support 13 by optical pyrometry or a thermocouple, or other temperature measurement means (not shown).

A radiant heating system is provided, to maintain the membrane 12 at an appropriate operating temperature. The radiant heating system may be comprised of heat lamps 50 illuminating the membrane support 13 with radiant energy through the clear, quartz bell jar 40. A lamp support 52 that holds the heat lamps 50 in position to effect uniform heating of the membrane 12 and membrane support 13 may have an inner surface formed, coated, and/or polished in such a way that it reflects infrared (IR) radiation through the clear quartz bell jar 40 toward the membrane 12, thereby improving the efficiency and uniformity of the radiant heating system. Room temperature air may circulate through the lamp support to maintain it and the quartz bell jar 40 at a temperature cooler enough to allow the use of elastomer seals, i.e., below about 250° C.

Operation—Preferred Embodiment—FIG. 2

The membrane assisted semi-closed (MASC) HVPE reactor in FIG. 2 may be operated according to the following procedure. First, the base 14 and collar 38 are sealed to one another using a high-temperature ceramic cement, such as are available commercially. The substrate 18 is secured to the pedestal 16 using an edge clamp 20. The crucible 26 is then filled with liquid gallium metal and placed on the base 14. The membrane support 13 with membrane 12 is put in place as shown in FIG. 2, and a seal is made between the base 14 and the membrane support 13 using, for instance, a Pd metal gasket.

The foreline valve 32 is now opened, providing fluid communication between the reactor volume 10 and a vacuum pump, and the air and gases within volume 10 are removed. A leak check is performed to insure that a) the reactor volume 10 is sealed, and b) gases other than $H_2$ cannot permeate the membrane 12.

The clear quartz bell jar 40 is put in place as shown in FIG. 2, and a seal is made between the collar 38 and the clear quartz bell jar 40 using, for instance, an o-ring made of a suitable high-temperature elastomer, such as commercially-available under the trade name Chemraz 653. The heat lamp support 52 with its heat lamps 50 is put in place surrounding the clear quartz bell jar, as shown in FIG. 2. The lamps 50 and the base heater 22 are turned on and the temperature of the substrate 18 and the membrane support 13 are ramped to appropriate operating temperatures.

The membrane support 13 is heated to a temperature between 850° C. and 1000° C. The substrate 18 is heated to a temperature between 600° C. and 750° C. Most preferably, the membrane support 13 is heated to 900° C. and the substrate 18 to 700° C.

Flowing sweep gas comprising 90% $N_2$ and 10% $O_2$ is introduced into the gap 42 between the membrane support 13 and the clear quartz bell jar 40. This flow is adjusted to approximately 5× whatever the operating $NH_3$ flow is, to adequately balance $H_2$ output.

HCl and $NH_3$ are introduced into the previously evacuated reactor volume 10 through ports 28 and 36. HCl reacts with the gallium (Ga) in the crucible 26, forming GaCl precursor gas, and thereafter GaN, HCl and $H_2$ are generated according to Eq. 1. Only a small amount of HCl is needed to sustain the reaction, since it is recycled, so the flow of HCl is shut off after a volume roughly equal to about 20% of the reactor's volume 10 capacity has been introduced.

A preferred pressure value is reached as $NH_3$ continues to flow into the reactor volume 10. This preferred value is between 0.1 atmosphere (1.4 p.s.i.) and 5 atmospheres (70 p.s.i), more preferably between 0.2 and 2 atmosphere, and most preferably between 0.5 and 1 atmosphere. Once the setpoint pressure value is reached, the $NH_3$ flow is used to maintain it, for instance using output from a pressure gauge or pressure sensor as feedback to PID microprocessor control of the $NH_3$ mass flow controller.

As GaN is generated. $NH_3$ is consumed and $H_2$ is produced. As the partial pressure of $H_2$ rises, it begins to permeate through the membrane 12 and react with $O_2$ in the sweep gas within the pores of the substrate support 13. Depending on the thickness of the membrane 12, it may be expected to pass $H_2$ at a rate between 0.25 and 10 standard cubic centimeters per minute (SCCM) per square centimeter of membrane area. This translates into a capacity of 0.62 to over 25 liters per minute for a hemispherical membrane with a radius of 20 centimeters. A 150 mm (6") GaN ingot grown at a rate of 50 microns per hour at 25% efficiency will produce about 150 SCCM of $H_2$. Even at 0.25 SCCM per square centimeter, the membrane would be adequate up to a growth rate of 200 microns per hour.

This reaction between $H_2$ and $O_2$ generates heat within the porous substrate support 13, and thereby reduces the power required by the lamps 50 to maintain the membrane support 13 at the desired operating temperature. This reaction of $H_2$ increases its concentration gradient between the volume 10 side and the gap 42 side of the membrane 12, which is what drives the $H_2$ diffusion. The $H_2O$ generated in this reaction is entrained in the sweep gas flow and exits to a flume, or scrubber, or vacuum pump through the exit pathway 48.

The generation of GaN, and the growth of a GaN ingot 01, may proceed until all of the Ga in the crucible 26 is consumed. At this point, the reaction described in Eq. 2 stops and the GaN growth reaction described in Eq. 1 is starved of GaCl, so it stops too. This stops the consumption of $NH_3$, and so the reactor volume 10 pressure can only be maintained by shutting off $NH_3$ flow.

Once N $H_3$ flow is stopped by the PID controller using pressure feedback, the GaN growth process is finished. If additional Ga metal is added to the crucible 26, preferably without stopping the growth process, then the GaN growth process may be extended.

When the GaN growth process stops, the ingot 04, membrane support 13, and base 14 may be allowed to cool slowly, preferably at about 1-3° C. per minute. For larger ingots, slower cooling is preferred to avoid thermal shock and fracturing. When the system reaches a reasonable handling temperature, it may be opened to retrieve the ingot 01 and any GaN parasitic growth. The process may be turned around and started once again with a new substrate 18 very quickly.

The MASC HVPE reactor described here may grow GaN ingots 150 mm (6") in diameter and 2 cm thick within a reactor volume 10 roughly 40 cm (16") wide and 20 cm (8") tall. A closed reactor operating at 10 ATM would require a reactor volume roughly 140 cm (55") wide and 140 cm (55") tall, would have almost 25 times the heated inner surface area, and much more expensive construction.

DETAILED DESCRIPTION

Alternative Embodiments

Pd membranes are extensively used for hydrogen separation in the petrochemical industry. The following are a few arguments against the use of a Pd membrane in HVPE, and the counter-arguments for its potential feasibility.

First, the manufacturers of Pd membranes (Johnson-Matthey, for example) caution against their use at temperatures higher than about 500° C., to avoid reactions between the Pd and the underlying support material. They also caution against their use in environments that contain chlorine, since the Pd membrane may be ruined by the formation of palladium chloride ($PdCl_2$). HVPE reactors typically run at temperatures as high as 1050° C., and contain chlorides.

The Pd:Cl phase diagram indicates that $PdCl_2$ is readily formed at the reactor temperatures common in the petrochemical industry, i.e., 300-500° C. It also indicates that this compound is known to begin decomposing into Pd and $Cl_2$ at 738° C., and at temperatures above 980° C. there exists only Pd metal and $Cl_2$ gas. Thus, a Pd membrane that is exposed to chlorine only at temperatures higher than 738° C. would not react with it.

The presence of HCl in the reactor may also be considered, but Hunka et. al. have shown that HCl ceases to be adsorbed on Pd surfaces at temperatures higher than about 300° C. Despite the affinity of hydrogen for Pd, the sticking coefficient of HCl is reportedly close to zero above 300° C.

Gallium is soluble in Pd, but only GaCl would come into contact with Pd within the HVPE reactor. Any reactions would require an initial Pd—GaCl adsorption bond to form, and that would be similar to the formation of Pd—HCl or Pd—ClH, or even Pd—ClGa, none of which can apparently occur at the temperatures of interest.

Another problematic scenario to consider is GaN whisker growth from the Pd surface, as was seen by Nam and coworkers. In that report, a gallium oxide precursor, $Ga_2O_3$, is reduced to $Ga_2O+O_2$ by heating. $Ga_2O$ was adsorbed on an AuPd alloy surface, where $H_2$ was able to react with it, resulting in the following:

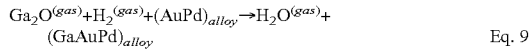

$$Ga_2O^{(gas)} + H_2^{(gas)} + (AuPd)_{alloy} \rightarrow H_2O^{(gas)} + (GaAuPd)_{alloy} \quad \text{Eq. 9}$$

Since there is no $Ga_2O$ in a normal HVPE environment, the analog of this reaction involving GaCl would require free H or Cl (vs. $H_2$ or $Cl_2$) in the vicinity of the surface, and only the former is a possibility, considering that the diffusion mechanism for $H_2$ through Pd splits $H_2$ into $2H^+ + 2e^-$. If a free H atom diffuses out of the Pd surface at a point coincident with an adsorbed Cl—Ga molecule, one might consider the following possibility:

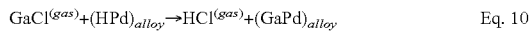

$$GaCl^{(gas)} + (HPd)_{alloy} \rightarrow HCl^{(gas)} + (GaPd)_{alloy} \quad \text{Eq. 10}$$

But this requires free atomic hydrogen to be available for reaction at the Pd surface. Since the diffusion of hydrogen through Pd is driven by the concentration gradient across the thickness of the Pd membrane, this is unlikely. In other words, if hydrogen recombination at the permeate side drives hydrogen adsorption and dissociation at the retentate side, the only available surface monatomic hydrogen is on the permeate side. On the retentate side of the Pd membrane, where GaCl exists, there is only diatomic hydrogen ($H_2$).

Another potential issue to consider with a Pd membrane is the production of highly reactive $H_2$ at the permeate side of the Pd membrane, and how this may affect the porous $Al_2O_3$ support. Okazaki et al. have shown that at temperatures above about 600° C., the highly active hydrogen is reported to reduce the $Al_2O_3$ support material at the Pd—$Al_2O_3$ interface and leave Al atoms free to migrate into and poison the Pd membrane. This issue is avoided altogether, by introducing $O_2$ into the sweep gas on the permeate side of the porous membrane support. The $O_2$ gas not only reacts with the free atomic hydrogen to form $H_2O$, it also oxidizes any free Al atoms, pinning them and limiting their diffusion and reversing the effect of $Al_2O_3$ reduction. The heat generated by this exothermic reaction also helps reduce the required external heat input, and eliminates the dangerous buildup of hydrogen gas in the reactor exhaust.

Thus it is feasible to use Pd as the membrane 12 in a MASC HVPE reactor. The Pd membrane 12 preferably has a thickness between 0.1 μm and 25 μm, more preferably between 0.5 μm and 10 μm, most preferably between 1 μm and 5 μm.

In the range of membrane hydrogen selectivities, from complete (100%) to zero, there exists a spectrum in which all the gases may escape in a ratio to one another. For instance, a porous membrane may allow $H_2$ to permeate at several times the volume rate of a heavier gas. Even such partial selectivity would provide an advantage by reducing the loss of GaCl and maintaining $H_2$ partial pressure at reasonable levels. It is therefore not the intent of this disclosure to confine the invention to preferable cases of 100% hydrogen selectivity, but to include all cases that provide the advantages of selectively removing $H_2$ and reducing precursor loss through the use of an $H_2$-selective exhaust.

CONCLUSION, RAMIFICATIONS, AND SCOPE

Accordingly, the reader will see that I have provided a method for performing HVPE growth that greatly reduces reactor size and cost, and reduces wasted materials relative to the prior art. Furthermore, according to the present invention, I have provided a technique that simplifies control of the thermodynamic and chemical reaction uniformity across a substrate during crystal growth, thus making scaling and the use of larger diameter substrates possible with a reduced risk of cracking. Also, according to the present invention, I have provided an HVPE crystal growth method and apparatus with the potential of greatly reducing power consumption costs and eliminating waste disposal costs compared to conventional prior art techniques.

While the above description contains many specifications, these should not be construed as limitations on the scope of the invention, but as exemplifications of the presently preferred embodiments thereof. Many other ramifications and variations are possible within the teachings of the invention.

Thus the scope of the invention should be determined by the appended claims and their legal equivalents, and not by the examples given.

What I claim is:

1. A membrane-assisted semi-closed reactor for continuously fabricating a III-nitride crystal by hydride vapor phase epitaxy while consuming only a group III metal and a hydride of nitrogen and emitting only hydrogen gas, comprising:
   a reactor volume enclosed by a base and enclosing surfaces of which a membrane that is selectively permeable to hydrogen is part of the enclosing surfaces;
   a gas entry port for providing a predetermined amount of HCl gas within the reactor volume;
   a crucible formed on the base for holding a group III metal within the reactor volume;
   a gas entry port for providing a controlled flow of hydride of nitrogen gas to the internal volume;
   a first heating system to heat the membrane and enclosing surfaces to a first temperature;
   and a second heating system to provide heating of the base and crucible to a second temperature.

2. The reactor set forth in claim 1, further comprising:

a pedestal formed on the base within the internal volume, onto which a substrate is clamped in an upward facing direction.

3. The reactor of claim 2, wherein:

a heating temperature of the first heating system ranges from 850° C. to 1000° C., and a heating temperature of the second heating system ranges from 600° C. to 750° C.

4. The reactor of claim 2, wherein the side of the membrane away from the internal volume is bathed in sweep gas flow introduced through a gas entry port into a gap outside the internal volume, and the sweep gas contains oxygen.

5. A method for continuously fabricating a III-nitride crystal by hydride vapor phase epitaxy while consuming and a hydride of nitrogen and emitting only hydrogen gas, the method comprising:

a) providing a reactor having an internal volume enclosed by a base and enclosing surfaces, of which a membrane that is selectively permeable to hydrogen is part of the enclosing surfaces;

b) providing a crucible on the base within the volume;

c) filling the crucible with a group III metal;

d) closing the reactor;

e) heating the membrane to a predetermined first temperature;

f) heating the base and crucible to a predetermined second temperature;

g) providing the internal volume with a fixed quantity of HCl gas;

h) providing the internal volume with a controlled flow of a hydride of nitrogen gas; and i) growing III-nitride crystal within the internal volume while emitting only hydrogen gas.

6. The method of claim 5, further comprising:

forming a pedestal on the base before closing the reactor;

clamping a substrate in a face up orientation onto the pedestal before closing the reactor;

and in addition to growing III-nitride crystal within the internal volume while emitting only hydrogen gas, epitaxially growing a III-nitride single crystal on the substrate by supplying the substrate with the precursor gases by virtue of circulation induced through the buoyancy of hydrogen added to the gas mixture by reactions between the III-nitride single crystal and the group III metal at the surface, and the removal of hydrogen from the gas mixture through the membrane.

7. The method of claim 6, wherein:

the III-nitride is gallium nitride;

the group III metal is gallium; and the hydride of nitrogen is ammonia.

8. The method of claim 6, wherein the heating temperature of the substrate is between 600° C. and 750° C. and the heating temperature of the membrane and enclosing surfaces is between 850° C. to 1000° C., wherein the convection circulation generated by the density gradient of the gas mixture between the substrate and the membrane within the internal volume provides deposition of the III-nitride from the precursor gases onto the substrate to fabricate the III-nitride crystal.

9. The method of claim 6, wherein the heated temperature of the pedestal is at least 200° C. cooler than the heated temperature of the rest of the enclosing surfaces.

10. The method of claim 5, wherein an internal pressure of the reactor is maintained at a predetermined value in a range of 0.1 atm to 10 atm by controlling the amount of HCl gas and flow of the hydride of nitrogen into the volume.

11. The method of claim 10, wherein the reactor is a closed reactor for all gases except hydrogen, which is removed through the membrane, and for a hydride of nitrogen, which is added to the internal volume to achieve and maintain an internal pressure, and wherein the method further comprises recycling HCl gas within the internal volume.

* * * * *